(12) United States Patent
Sugihara

(10) Patent No.: US 7,288,950 B2
(45) Date of Patent: Oct. 30, 2007

(54) CONTACTING COMPONENT, METHOD OF PRODUCING THE SAME, AND TEST TOOL HAVING THE CONTACTING COMPONENT

(75) Inventor: Osamu Sugihara, Tokyo (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 10/634,925

(22) Filed: Aug. 6, 2003

(65) Prior Publication Data

US 2004/0046582 A1 Mar. 11, 2004

(30) Foreign Application Priority Data

Aug. 7, 2002 (JP) .............................. 2002-229447

(51) Int. Cl.
*G01R 31/02* (2006.01)
(52) U.S. Cl. ...................... 324/757; 324/754
(58) Field of Classification Search ................ None
See application file for complete search history.

(56) References Cited

U.S. PATENT DOCUMENTS

| | | | | |
|---|---|---|---|---|
| 5,151,653 A | * | 9/1992 | Yutori et al. ............... | 324/754 |
| 5,973,405 A | * | 10/1999 | Keukelaar et al. .......... | 257/780 |
| 6,359,337 B1 | * | 3/2002 | Keukelaar et al. .......... | 257/780 |
| 6,573,738 B1 | * | 6/2003 | Matsuo et al. .............. | 324/754 |
| 6,815,962 B2 | * | 11/2004 | Hirano et al. .............. | 324/754 |

FOREIGN PATENT DOCUMENTS

| | | | |
|---|---|---|---|
| JP | 60033327 A | * | 2/1985 |
| JP | 3050520 B2 | | 3/2000 |
| JP | 3096233 B2 | | 8/2000 |
| JP | 3096235 B2 | | 8/2000 |
| JP | 2000345314 A | * | 12/2000 |
| JP | 2001-250851 A | | 9/2001 |
| JP | 3246841 B2 | | 11/2001 |

OTHER PUBLICATIONS

Bao et al, "A novel nanostructure of nickel nanotubes encapsulated in carbon nanotubes," 2003 (month unavailable), Chem. Commun. (copyright: The Royal Society of Chemistry 2003), pp. 208-209.*
"Hawley's Condensed Chemical Dictionary" Eleventh edition by N. Irving Sax and Richard J. Lewis, Sr. 1987 (6 pages).*

* cited by examiner

*Primary Examiner*—Paresh Patel
(74) *Attorney, Agent, or Firm*—Sughrue Mion, PLLC

(57) ABSTRACT

A contacting component has a probe contact formed by plating and adapted to be contacted with a target portion. The contacting component includes an insulating substrate, a conductive circuit formed on one surface of the insulating substrate, and the probe contact is made of a conductive material and formed on the other surface of the insulating substrate. The conductive circuit and the probe contact are electrically connected in a through hole penetrating the insulating substrate. The probe contact includes a bump contact of a convex shape, the bump contact is formed by plating and having a surface which has a shape of a semispherical protrusion to be contacted with the target portion. The bump contact is made of a material containing a metal and carbon, the content of carbon falling within a range between 0.2 at % and 1.2 at %, both inclusive.

6 Claims, 2 Drawing Sheets

CONTACTING COMPONENT, METHOD OF PRODUCING THE SAME, AND TEST TOOL HAVING THE CONTACTING COMPONENT

This invention claims priority to prior Japanese patent application JP 2002-229447, the disclosure of which is incorporated herein by reference.

BACKGROUND OF THE INVENTION

This invention relates to a contacting component for making electrical contact with a target portion (such as an electrode) formed on a test object.

A contacting component is used in testing a semiconductor circuit or the like. For example, the contacting component comprises an insulating substrate, a conductive circuit formed on one surface of the insulating substrate, and a bump contact (convex contact) as a probe contact made of a conductive material and protruding on the other surface of the insulating substrate. The conductive circuit and the bump contact are electrically connected in a through hole penetrating the insulating substrate.

Traditionally, the bump contact is made of a conductive metal, such as nickel or a nickel alloy, and is formed by electrolytic plating because production is easy.

When the semiconductor circuit or the like is tested, the bump contact is repeatedly brought into press contact with a target portion (such as an electrode) to be measured and tested.

Therefore, if the bump contact has a low hardness, the bump contact may be deformed and worn. In this event, an accurate test can not be carried out and the life of the bump contact is short. On the other hand, if the bump contact has an increased hardness, the bump contact tends to suffer occurrence of cracks. In this event, the bump contact may break off from the insulating substrate. Thus, trade-off between the contradictory problems exists.

Furthermore, the bump contact is readily released or separated from the insulating substrate during formation of the bump contact or during repetition of a press contacting operation. The problem of such separation of the bump contact has not been considered so far.

SUMMARY OF THE INVENTION

It is therefore an object of this invention to provide a contacting component having a probe contact which is excellent in durability and which is prevented from being released or separated.

In order to achieve the above-mentioned object, this invention has following structures.

Structure 1

A contacting component having a probe contact formed by plating and adapted to be contacted with a target portion;
the probe contact being made of a polycrystalline material having a crystal grain size not smaller than 10 nm and not greater than 40 nm.

Structure 2

A contacting component having a probe contact formed by plating and adapted to be contacted with a target portion;
the probe contact being made of a material containing a metal and carbon, the content of carbon falling within a range between 0.2 at % and 1.2 at %, both inclusive.

Structure 3

A contacting component according to structure 2, wherein the carbon is contained in the form of metal carbide.

Structure 4

A contacting component according to structure 2 or 3, wherein the probe contact is made of nickel or a nickel alloy as a main material, the carbon being contained in the form of nickel carbide.

Structure 5

A contacting component according to any one of structures 1 to 4.
wherein the probe contact is made of a material having a hardness between 450 Hv and 950 Hv in Vickers hardness and a stress not greater than 30 kg/mm$^2$.

Structure 6

A contacting component according to any one of structures 1 to 5, comprising:
an insulating substrate;
a conductive circuit formed on one surface of the insulating substrate; and
the probe contact made of a conductive material and formed on the other surface of the insulating substrate;
the conductive circuit and the probe contact being electrically connected in a through hole penetrating the insulating substrate.

Structure 7

A test tool for use in testing a semiconductor device, at least comprising:
a contacting component according to structure 1; and
a wiring substrate comprising an insulating substrate provided with a wiring layer formed on the insulating substrate.

Structure 8

A test tool according to structure 7, wherein the wiring substrate is a double-sided wiring substrate provided with first and second wiring layers formed on opposite surfaces of the insulating substrate, respectively, the first and the second, wiring layers being electrically connected to each other in a through hole penetrating the insulating substrate.

Structure 9

A test tool according to structure 7, wherein the wiring substrate is a multilayer wiring substrate in which a plurality of wiring layers of a multilayer structure and a plurality of insulating layers are alternately laminated on the insulating substrate, every adjacent ones of the wiring layers being electrically connected in a contact hole formed in the insulating layer between the adjacent wiring layers.

Structure 10

A test tool for use in testing a semiconductor device, at least comprising:
a contacting component according to structure 2; and
a wiring substrate comprising an insulating substrate provided with a wiring layer formed on the insulating substrate.

Structure 11

A test tool according to structure 10, wherein the wiring substrate is a double-sided wiring substrate provided with first and second wiring layers formed on opposite surfaces of the insulating substrate, respectively, the first and the second wiring layers being electrically connected to each other in a through hole penetrating the insulating substrate.

Structure 12

A test tool according to structure 10, wherein the wiring substrate is a multilayer wiring substrate in which a plurality of wiring layers each having a multilayer structure and a plurality of insulating layers are alternately laminated on the insulating substrate, every adjacent ones of the wiring layers being electrically connected in a contact hole formed in the insulating layer between the adjacent wiring layers.

Structure 13

A method of producing a contacting component according to structure 6, the method comprising the steps of:

preparing an insulating substrate provided with a conductive metal film formed on one surface of the insulating substrate to serve as a conductive circuit;

forming a through hole in the insulating substrate at a predetermined position; and forming the probe contact electrically connected to the conductive metal film by connecting one of plating electrodes to the conductive metal film, dipping the insulating substrate into a plating solution, and carrying out electrolytic plating.

Structure 14

A method according to structure 13, wherein the amount of an organic substance soluble in the plating solution and added to the plating solution is adjusted to control the content of carbon in the probe contact.

Structure 15

A method according to structure 13, wherein the electrolytic plating is carried out with a plating current density not smaller than $1 A/dm^2$ and not greater than $60 A/dm^2$.

DESCRIPTION OF THE PREFERRED EMBODIMENT

Figure 1:
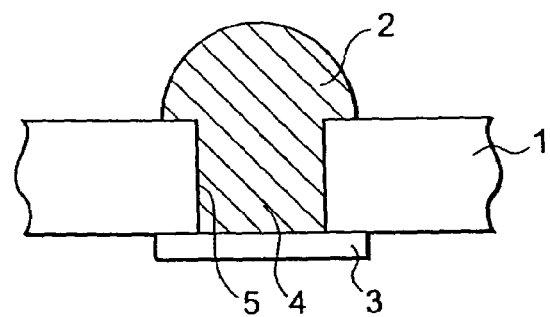
FIG. 1 is a partial sectional view for describing a contacting component according to one embodiment of this invention.

The present inventor has found out that the hardness and the separation resistance of a probe contact, such as a bump contact, are closely related to the crystal grain size of the probe contact and the carbon content in the probe contact and that, by adjusting the crystal grain size and the carbon content, the hardness and the separation resistance of the probe contact can be controlled.

At first, the hardness and the separation resistance of the probe contact can be controlled by adjusting the crystal grain size of the material of the probe contact formed by electrolytic plating or the like. Specifically, the following facts have been found out as regards the relationship between the hardness and the separation resistance of the probe contact and the crystal grain size.

(1) If the crystal grain size is excessively large, a sufficient hardness can not be obtained and the probe contact is easily separated.

(2) If the crystal grain size is reduced, the hardness is increased.

(3) If the crystal grain size is reduced, the surface roughness of the probe contact is reduced so that the adhesion of the probe contact to an insulating substrate is increased and the separation resistance of the probe contact is improved.

(4) If the crystal grain size is excessively small, the hardness is excessively high so that the probe contact tends to suffer a defect such as occurrence of cracks. In addition, the stress of the probe contact is excessively large to cause separation of the probe contact.

(5) From (1) to (4) described above, the crystal grain size preferably falls within a range not smaller than 10 nm and not greater than 40 nm, more preferably within a range not smaller than 15 nm and not greater than 35 nm. In case where the probe contact is made of nickel or a nickel alloy, the crystal grain size preferably falls within a range not smaller than 15 nm and not greater than 35 nm (Structure 1).

As described above, the first invention is characterized in that the crystal grain size is reduced (adjusted to a predetermined crystal grain size) in order to increase the hardness (to obtain a predetermined hardness).

Second, it has been found out that, if the probe contact is produced by electrolytic plating so that a predetermined amount (0.2 at % to 1.2 at %) of carbon is contained in the probe contact made of a material containing a metal and carbon (Structure 2), the hardness can be increased (specifically, not lower than 450 Hv and not higher than 950 Hv). Presumably, by controlling the amount of carbon contained in the probe contact, the probe contact having a desired crystal grain size is obtained and the hardness of the probe contact is adjusted within a predetermined range. Although the mechanism thereof is not clear, it is supposed that, during a process of forming the probe contact by the electrolytic plating or the like, the grain size of crystals forming the probe contact is reduced by addition of carbon and carbon is concentrated to a grain boundary between adjacent metal crystals, thereby increasing the hardness. Alternatively, it is supposed that, during a process of forming the probe contact by the electrolytic plating or the like, the grain size of crystals forming the probe contact is reduced by addition of carbon and metal carbide high in hardness enters between adjacent metal crystals, thereby increasing the hardness as a whole of the probe contact.

Furthermore, carbon contained in the probe contact is preferably present in the form of metal carbide (for example, nickel carbide) (Structures 3 and 4).

Presence of carbon contained in the probe contact improves the wear resistance and the corrosion resistance of the probe contact. Furthermore, presence of carbon advantageously suppresses scattering of a metal, such as Ni, contained in the probe contact into a target portion (for example, an Al electrode) to be contacted by the probe contact.

The carbon content in the probe contact can be adjusted by adding, to the plating solution, an organic substance soluble in the plating solution and adjusting a plating condition. Depending upon the kind of the organic substance to be added to the plating solution, the content of the organic substance and the plating condition are appropriately adjusted.

The carbon content in the probe contact is preferably 0.2 at % to 1.5 at %, more preferably 0.2 at % to 1.2 at % (Structure 2), further preferably 0.3 at % to 1.05 at %. The carbon content in the probe contact is preferably the amount of carbon contained in the form of metal carbide.

If the carbon content is too small, a sufficient hardness can not be obtained. If the carbon content is too large, the probe contact has an excessively large stress and often suffers a defect such as occurrence of cracks.

As described above, the second invention is characterized in that a predetermined amount of carbon (preferably in the form of metal carbide) is contained in order to increase the hardness (to obtain a predetermined hardness). Alternatively, a predetermined amount of carbon (preferably in the form of metal carbide) is contained in order to reduce the crystal grain size (to obtain a predetermined crystal grain size).

In this invention, the probe contact has a hardness preferably between 450 Hv and 950 Hv in Vickers hardness (Structure 5), more preferably between 500 Hv and 800 Hv.

If the hardness is low, the probe contact is deformed or worn as a result of a contacting operation with a test object. In this event, an accurate test can not be carried out and the life of the probe contact is shortened. If the hardness is excessively high, the probe contact tends to suffer a defect such as occurrence of cracks.

In this invention, the crystal grain size and the carbon content are adjusted so as to obtain the hardness within the above-mentioned range.

In this invention, the probe contact has a stress (measured as a film stress) within a range preferably not greater than 30 kg/mm$^2$ (Structure 5), more preferably not greater than 20 kg/mm$^2$, further preferably not greater than 15 kg/mm$^2$.

If the stress is excessively large, the probe contact is easily separated.

In this invention, the crystal grain size and the carbon content are adjusted so as to obtain the stress in the above-mentioned range.

As described above, according to this invention, a contacting component having a probe contact superior in durability is obtained.

The contacting component having a probe contact superior in durability is suitable as a contacting component in a test tool for use in testing a semiconductor device or the like.

In particular, this invention provides a contact board which has a probe contact with a hardness suitable as a contacting component of a contact board for use in a burn-in test or the like and which is prevented from separation of the probe contact.

The first and the second inventions are also useful as a plating film of the probe contact. That is, the first and the second inventions are useful in case where the "probe contact" in the structures 1 to 5 is replaced by a "plating film of the probe contact".

The plating mentioned in this invention includes electrolytic plating or electroless plating. Either the electrolytic plating or the electroless plating may be used in this invention. In case of the probe contact for the contacting component in the test tool for testing the semiconductor device, the electrolytic plating is advantageous because a high quality is assured if an aperture size is as small as several micrometers to several hundreds micrometers. If the aperture size is as large as on the order or millimeters, the electroless plating may be used.

Additives

The organic substance to be added to the plating solution must be dissolved into the plating solution and must have a function such that carbon is taken into the probe contact when the probe contact is produced by electrolytic plating (electric plating) or the like. For example, the organic substance may be carbonic oxide ($H_2CO_3$), carbon dioxide ($CO_2$), saccharine, sucrose, or glucose.

As the organic substance mentioned above, use may be made of an additive, such as a brightening agent generally used in plating. Use of an additive having a function of increasing the hardness of a film (will hereinafter be referred to as a hardness enhancer) is preferable because a synergistic effect in cooperation with this invention is expected. Following an increase in hardness, the film stress is generally increased. In view of the above, it is preferable to use an additive having a stress relaxation function (will hereinafter be referred to as a stress relaxer) in combination because a synergistic effect in cooperation with this invention is expected.

For example, the hardness enhancer may be (1) a substance having a double bond between C and O (C=O) (for example, carbon monoxide, ketone, aldehyde, formalin, tamarin, alkoxytamarin, carboxylic acid, nickel formate, sodium formate, protein such as gelatin), (2) a substance having a double bond between C and C (C=C) (for example, alkylene carboxy ester, alkylene aldehyde, aryl aldehyde, aryl aldehyde sulfonate, aryl vinyl alkaloid, tamarin and its derivative, or the like), (3) a substance having a triple bond between C and C (C—C) (for example, acetylene derivative, acetylene alcohol, butyne-1,4-diol, propagyl alcohol, or the like), (4) various colorants, (5) a substance having a triple bond between C and N (C=N) (for example, ethylene cyanohydrin), (6) a substance having a N—C=S bond (for example, thiourea, thiomalic acid, a cyclic compound of thiourea, or the like), (7) a substance having a double bond between N and N (N=N) (for example, an azo colorant), and (8) a substance having a single bond between C and O (C—O) (for example, glucose).

As the stress relaxer, a substance having a bond "—C—" may be used. For example, (1) aromatic hydrocarbon (such as benzene and naphthalene), (2) degraded aromatic hydrocarbon (such as toluene, xylene, naphtyl amine, toluidine, and benzyl naphthalene), (3) alkyl chain compound (such as vinyl and anyl), (4) sulfonic acid, sulfonate (such as sodium mono, di-, trinaphthalenesulfonate), amide sulfonate (such as saccharin para-toluene sulfonamide), imide sulfonate, and sulfon).

Next, description will be made of a contacting component of this invention.

Referring to FIG. 1, the contacting component comprises an insulating substrate 1 having one surface provided with a bump contact 2 and the other surface provided with an electrode 3 forming a part of a conductive circuit. The insulating substrate 1 is provided with a through hole 5. The bump contact 2 and the electrode 3 forming a part of the conductive circuit are positioned opposite to each other with the insulating substrate 1 interposed therebetween and are connected to each other by a conductive portion 4 comprising a conductive substance filled in the through hole 5.

The insulating substrate 1 is not particularly restricted and may be made of any substance which is electrically insulative. Preferably, the insulating substrate 1 is not only electrically insulative but also flexible. Specifically, the insulating substrate 1 may be made of polyimide resin, polyester resin, epoxy resin, urethane resin, polystyrene resin, polyethylene resin, polyamide resin, ABS resin, polycarbonate resin, silicone resin. Whether thermosetting resin or thermoplastic resin, an appropriate material may be selected depending upon the purpose. Among the above-mentioned resins, the polyimide resin excellent in heat resistance and chemical resistance and having a sufficient mechanical strength is preferably used in case where the contacting component is used in a burn-in board or a probe card. The insulating substrate 1 may have any desired thickness. However, in order to assure a sufficient mechanical strength and a sufficient flexibility, the thickness of the insulating substrate 1 is typically between 2 μm and 500 μm, preferably between 10 μm and 150 μm. Furthermore, if the contacting component is used in the burn-in board or the probe card, use is preferably made of an insulating resin film having a thickness between 10 μm and 50 μm.

The electrode 3 forming a part of the conductive circuit is formed inside of the insulating substrate or on the other surface of the insulating substrate at a position corresponding to a predetermined position where the bump contact is to be formed on the one surface of the insulating substrate. The electrode is electrically connected to the bump contact. The conductive circuit includes a circuit pattern formed by a conductor and a semiconductor and various circuit elements, such as a contact point, a coil, a resistor, and a capacitor. Thus, the conductive circuit may be referred to as a conductive pattern. The conductive circuit may be formed outside the insulating substrate (for example, on a wiring substrate). As a material of the conductive circuit or the electrode forming a part thereof, no specific restriction is imposed as far as the material has conductivity, whether the conductor or the semiconductor. Preferably, a known good conductor metal is used. For example, use may be made of a single metal such as a copper, gold, silver, platinum, lead, tin, nickel, iron, cobalt, indium, rhodium, chromium, tungsten, and ruthenium, and various kinds of alloys containing the above-mentioned metals, such as solder, nickel-tin, gold-cobalt. Alternatively, a multilayer structure may be formed by the use of a plurality of kinds of materials selected from the metals and the alloys mentioned above. The thickness of the conductive circuit or the electrode forming a part thereof is not restricted.

The conductive circuit or the electrode forming a part of the conductive circuit may be formed by the use of a method comprising the steps of forming a conductive material layer over an entire surface of the insulating substrate and partially removing the conductive material layer by etching to leave a desired circuit pattern.

The diameter of the through hole for connecting the electrode forming a part of the conductive circuit and the bump contact is not restricted. However, it is preferable that the through hole has a greater diameter as far as adjacent through holes are not connected to each other. This is because the electric resistance of the conductive portion can be reduced. Practically, the through hole has a diameter between 5 µm and 200 µm, particularly between 10 µm and 80 µm. The through hole may be formed by laser machining, photolithography, chemical etching using a resist different in chemical resistance from the insulating substrate, plasma machining, mechanical machining such as punching, and so on. Among others, the laser machining using an excimer laser, a carbon dioxide laser, a YAG laser, or the like is preferable because it is possible to perform micromachining of the through hole having a desired diameter and a desired pitch so that a fine-pitch arrangement of the bump contacts can be achieved. The through hole is not only formed to be perpendicular to a plane of the insulating substrate but also may be formed at a predetermined angle with respect to the plane of the insulating substrate so as to electrically connect the electrode and the bump contact slightly offset from a position exactly at the back of each other.

Essentially, the conductive portion is formed in the through hole and adapted to electrically connect the bump contact and the electrode forming a part of the conductive circuit. For example, the conductive portion comprises a conductive substance filled in the through hole or a conductive substance layer formed on an inner wall surface of the through hole by through-hole plating.

The conductive portion may be formed by electrolytic plating, electroless plating, deposition such as CVD, mechanical fitting of the conductive substance into the through hole, and so on. Among others, it is preferable to use a method comprising the steps of making the electrode forming a part of the conductive circuit be exposed in the through hole and filling the conductive substance in the through hole by electrolytic plating with the electrode used as a negative terminal. This method assures reliable conduction and is easy to perform.

The probe contact (including the bump contact) may have any shape, whether protruding from the plane of the insulating substrate or not, for example, a convex shape, a concave shape, or a flat pad-like shape, depending upon the shape of the target portion to be contacted by the probe contact. Like a known bump contact, the probe contact as a semispherical protrusion is most advantageous. The "semispherical" referred to herein includes not only a perfect semisphere but also a protrusion having a monotonous curved surface.

The surface of the probe contact may be a smooth mirror surface or a roughened surface. In order to improve the contact reliability, the roughened surface is preferable. The roughened surface may be obtained through mechanical roughening by filing or sanding, chemical roughening using a chemical solution, formation of irregularities by photolithography, formation of a surface layer on the surface of the probe contact in a roughening condition (such as matting), and so on. As a material of the surface layer, use may be made of rhodium, ruthenium, cobalt, chromium, tungsten, or the like.

The material of the probe contact (including the bump contact) is not specifically limited. However, because the probe contact is formed by plating, use is made of a metal or an alloy. Preferably, use is made of an inexpensive good conductor used in a known bump, for example, nickel, a nickel-tin alloy, a nickel-palladium alloy, and copper.

Next, description will be made of a method of producing the contacting component according to this invention.

A method of producing a contacting component according to this invention comprises the steps of preparing an insulating substrate provided with a conductive metal film formed on one surface of the insulating substrate to serve as a conductive circuit; forming a through hole in the insulating substrate at a predetermined position; and forming the probe contact electrically connected to the conductive metal film by connecting one of plating electrodes to the conductive metal film, dipping the insulating substrate into a plating solution, and carrying out electrolytic plating. (Structure 13)

For the insulating substrate, the conductive metal film, and the probe contact, the above-mentioned materials may be used.

The amount of an organic substance soluble in the plating solution and added to the plating solution is adjusted to control the content of carbon in the probe contact, thereby obtaining a desired hardness and a desired stress of the probe contact. (Structure 14)

For the organic substance to be dissolved into the plating solution, the above-mentioned substances may be used.

The plating current density in the electrolytic plating is a factor mainly controlling the stress of the probe contact. Preferably, the plating current density is not smaller than $1 A/dm^2$ and not greater than $60 A/dm^2$. (Structure 15)

In case where the organic substance soluble in the plating solution is added, the stress of the probe contact tends to be reduced following an increase in plating current density. If the plating current density falls within a range of $1-5 A/dm^2$, the stress of the probe contact tends to be drastically increased following an increase in plating current density (the stress of the probe contact tends to be drastically reduced following a decrease in plating current density). If the plating current density falls within a range not lower than $5 A/dm^2$, the stress of the probe contact tends to be moderately reduced following an increase in plating current density (the stress of the probe contact tends to be moderately increased following a decrease in plating current density).

If the plating current density is smaller than $1 A/dm^2$, the variation in both of the hardness and the stress of the probe contact is great, which makes it difficult to control the hardness and the stress. In addition, the stress exceeds 30 $kg/mm^2$ so that the probe contact is easily separated. On the other hand, if the plating current density exceeds $60 A/dm^2$, the variation in both of the hardness and the stress is small but the plating efficiency is decreased. In addition, hydrogen tends to be trapped in the through hole formed in the insulating substrate so that the growth of a plating metal film is difficult.

Preferably, the plating current density is greater than 4A/dm² and not greater than 40A/dm².

The plating solution is preferably kept at a temperature between 35° C. and 80° C., more preferably between 40° C. and 65° C. in order to grow a plating film in all of a number of through holes without leaving a void or vacancy.

EXAMPLES 1-5 AND COMPARATIVE EXAMPLES 1-2

Description will be made of specific examples of preparation of the contacting component illustrated in FIG. 1.

Figure 2A:
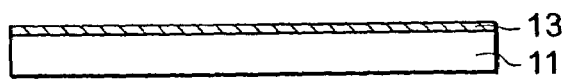
FIGS. 2A through 2C are partial sectional views for describing a production process of the contacting component illustrated in FIG. 1.

At first referring to FIG. 2A, a two-layer film was prepared which comprises a commercially-available polyimide film 11 as the insulating substrate and a copper foil 13 to serve as the conductive circuit. Herein, use was made of "S'PERFLEX" manufactured and sold by Sumitomo Metal Mining Co., Ltd. The polyimide film 11 had a thickness of 25 μm and the copper foil 13 had a thickness of 16 μm.

Figure 2B:
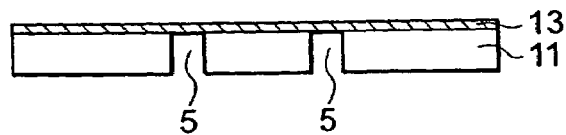

Referring to FIG. 2B, the polyimide film 11 was irradiated with a KrF excimer laser (wavelength of 248 nm) at predetermined positions where bump contacts were to be formed. As a consequence, a plurality of through holes 5 were formed in the polyimide film 11 to expose one surface of the copper foil 13 at the bottom of each through hole 5.

Then, plasma ashing was carried out in order to remove carbon adhered to the surface of the polyimide film 11 upon forming the through holes 5 by the excimer laser and to improve wettability of the surface of the polyimide film 11 to a plating solution.

Figure 2C:
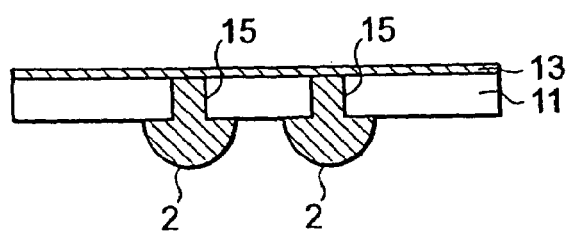

Next, the other surface of the copper foil 13 was protected so as not to be plated. Thereafter, a plating electrode was connected to a part of the copper foil 13. Using the copper foil 13 exposed in each through hole 5 as a negative terminal, electrolytic plating (electric plating) of a nickel alloy was carried out Specifically, referring to FIG. 2C, the nickel alloy was deposited and filled in the through hole 5. Deposition was further continued to grow the nickel alloy as a semispherical protrusion having the height of 25 μm from the surface of the polyimide film 11. Thus, bump contacts 2 were formed. Upon carrying out the electric plating, a hardness enhancer and a stress relaxer were added to the plating solution. By adjusting the plating condition and the amounts of the hardness enhancer and the stress relaxer, the crystal grain size and the carbon content were varied.

Finally, the copper foil 13 was patterned by etching to form the conductive circuit (not shown) and the electrode 3 forming a part thereof. Thus, the contacting component illustrated in FIG. 1 was obtained.

Table 1 shows the crystal grain size (nm) of the bump contact, the carbon content (at %) in the bump contact (the amount of carbon contained in the form of nickel carbide), the hardness (Hv) of the bump contact, the stress (kg/mm²) of the bump contact, presence/absence of cracks in the bump contact immediately after formation of the bump contact, the separation of the bump contact immediately after formation of the bump contact, and the durability of the bump contact against repetition of a contacting operation.

The crystal grain size of the bump contact was measured by an X-ray diffractmeter as an average grain size.

The carbon content in the bump contact was measured by X-ray Photoelectro Spectroscopy (XPS). Similarly, the presence of metal carbide was confirmed by XPS.

The hardness of the bump contact was measured by a micro Vickers hardness tester for a sample plated on a copper plate to the thickness of 30 μm or more.

The stress of the bump contact was measured by a spiral plating stress detector as film stress.

Presence/absence of cracks in the bump contact was observed by a microscope.

The separation of the bump contact was tested by a tape separation (peeling) test using an adhesive tape (for example, Cellotape (Registered Trademark) manufactured and sold by Nichiban Co., Ltd.).

The durability of the bump contact was tested by repetition of a contacting operation by a wafer batch testing contact board which will later be described.

TABLE 1

| | Grain Size (nm) | Carbon Content (at %) | Hardness (Hv) | Stress (kg/mm²) | Crack | Separation | Durability |
|---|---|---|---|---|---|---|---|
| Comparative Example 1 | 8 | 1.60 | 960 | 35.0 | occurred | occurred | no |
| Example 1 | 18 | 1.02 | 800 | 16.3 | not occurred | not occurred | yes |
| Example 2 | 20 | 0.88 | 745 | 13.6 | not occurred | not occurred | yes |
| Example 3 | 24 | 0.51 | 600 | 10.8 | not occurred | not occurred | yes |
| Example 4 | 34 | 0.42 | 577 | 10.6 | not occurred | not occurred | yes |
| Example 5 | 40 | 0.33 | 457 | 10.5 | not occurred | not occurred | yes |
| Comparative Example 2 | 50 | 0.18 | 200 | 11.8 | not occurred | occurred | no |

From Table 1, it is understood that, if the crystal grain size is excessively large (Comparative Example 2), a sufficient hardness is not obtained and the bump contact is easily separated.

From Examples 1-5, it is understood that, as the crystal grain size becomes smaller, the hardness is increased.

In case where the crystal grain size is too small (Comparative Example 1), the hardness is excessively high so that a defect such as crack is caused to occur in the bump contact and the stress of the bump contact is increased, resulting in separation of the bump contact.

From Table 1, it is understood that the crystal grain size is preferably between 10 nm and 40 nm.

From Table 1, it is understood that, if the carbon content is too small (Comparative Example 2), a sufficient hardness can not be achieved. It is also understood that, if the carbon content is excessively large (Comparative Example 1), the stress is excessively increased and a defect such as occurrence of cracks is caused to occur in the bump contact, resulting in separation of the bump contact.

By the ESCA (Electron Spectroscopy for Chemical Analysis), it was confirmed that nickel carbide was formed in each bump contact.

As seen from Table 1, in the contacting components in Examples 1-5, the bump contact was not separated by the adhesive tape. In the contacting component in Comparative Example 2, the bump contact was easily separated because the crystal grain size was excessively large and the adhesion was poor. In the contacting component in Comparative Example 1, the bump contact was also separated because of presence of cracks immediately after formation of the bump contact and the high stress.

EXAMPLE 6

Figure 3:
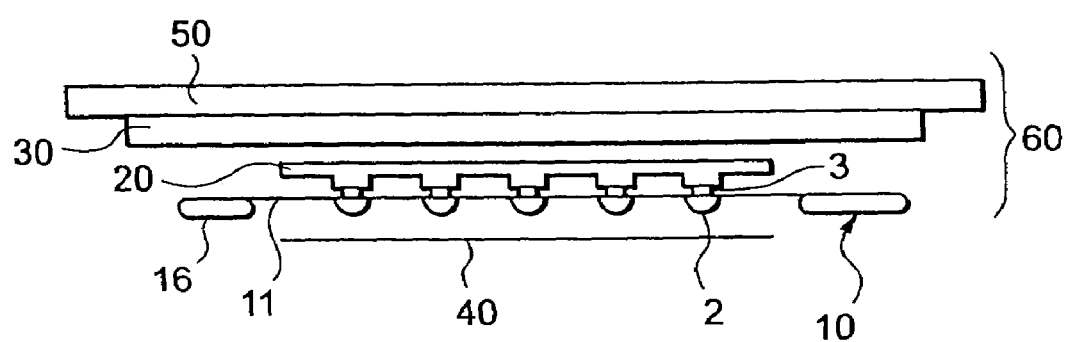
FIG. 3 is a schematic view for describing a contact board having the contacting component in FIG. 1.

Referring to FIG. 3, in this embodiment (Example 6), production was made of the wafer batch testing contact board 60 having the contacting component produced in each of the examples described above.

In FIG. 3, a membrane ring 10 was prepared which comprises a ring 16 of silicon carbide and a polyimide film 11 supported by the ring 16 in an extended state and provided with the contacting component described in conjunction with FIG. 1.

The membrane ring 10 was provided with a plurality of electrodes 3 formed on the other surface opposite to the one surface on which the bump contacts 2 protruded. An anisotropic conductive rubber sheet 20 adapted to electrically connect the electrodes and a glass muitilayer wiring substrate or board 30 was superposed or laid on the membrane ring 10. Furthermore, the glass multilayer wiring board 30 was superposed or laid on the anisotropic conductive rubber sheet 20. Thereafter, a printed board 50 was placed on the glass multilayer wiring board 30. Thus, the wafer batch testing contact board 60 was obtained.

The above-mentioned glass multilayer wiring board 30 comprises a glass substrate as an insulating substrate on which a plurality of wiring layers of a multilayer structure (for example, Cr/Cu/Ni or Cr/Cu/Ni/Au) and a plurality of insulating layers (for example, polyimide) are alternately laminated in the manner disclosed in, for example, Japanese Unexamined Patent Publication No. 2000-39451. Every adjacent ones of the wiring layers are electrically connected to each other in a contact hole formed in the insulating layer between the adjacent wiring layers.

Evaluation of Durability of Bump Contact

Next, a durability test was performed for the contact board having the contacting component in each of Examples and Comparative Examples.

The durability test was carried out in the following manner. Preparation was made of a silicon wafer 40 provided with a semiconductor device having a plurality of Al electrodes. By the use of the contact board, the Al electrodes on the silicon wafer 40 were repeatedly contacted with the bump contacts 2. Then, the shape and the size of the bump contact 2 were observed by a microscope. The number of times of the contacting operation was 5000. The contacting condition was log/pin (the load of log per bump).

In the contact board having the contacting component in each of Examples 1 to 5, substantial deformation or wear was not observed even after 5000 times of the contacting operation. Even after 2,000,000 times of the contacting operation, deformation was as small as about 2 µm. On the other hand, in the contact board using the contacting component in Comparative Example 2, the bump contacts were deformed and worn by about 20 µm after 5000 times of the contacting operation. This is because the hardness was low. In the contact board using the contacting component in Comparative Example 1, breakage and separation of the bump contacts were observed due to the cracks already present in the bump contacts and the high stress of the bump contacts. The above-mentioned results are shown in Table 1 as the durability.

In Example 6, the contact board was prepared by the use of the glass multilayer wiring board. Not being limited thereto, use may be made of a double-sided wiring board comprises an insulating substrate, such as a glass substrate, provided with wiring layers formed on opposite surfaces of the insulating substrate, respectively, and electrically connected to each other through a conductive member formed in a through hole penetrating the insulating substrate. The double-sided wiring board may be a multilayer double-sided wiring board having a plurality of wiring layers laminated through insulating layers.

The contacting component according to this invention is not only used in the burn-in board for wafer batch testing described above but also used in a CSP (Chip Size Package) test, a tape carrier for a one-chip burn-in test, a burn-in probe card, a membrane probe card, and so on.

According to this invention, it is possible to control the hardness and the separation resistance of the probe contact by adjusting-the crystal grain size of the probe contact and the carbon content in the probe contact. Thus, the contacting component having the probe contact excellent in durability can be obtained.

The contacting component having the probe contact excellent in durability is suitable as a contacting component in a test tool for use in testing a semiconductor device.

In particular, it is possible to obtain a contact board which is provided with a bump contact having a hardness suitable as a contacting component of a contact board for use in a burn-in test or the like and which is prevented from separation of the bump contact.

What is claimed is:

1. A contacting component having a probe contact formed by plating and adapted to be contacted with a target portion;

the contacting component comprising an insulating substrate, a conductive circuit formed on one surface of the insulating substrate, and the probe contact made of a conductive material and formed on the other surface of the insulating substrate;

the conductive circuit and the probe contact being electrically connected in a through hole penetrating the insulating substrate;

the probe contact comprising a bump contact of a convex shape, the bump contact being formed by plating and having a surface which has a shape of a semispherical protrusion to be contacted with the target portion;

the bump contact being made of a material containing a metal and carbon, the content of carbon falling within a range between 0.2 at % and 1.2 at % both inclusive;

the bump contact being made of nickel or a nickel alloy as a main material, the carbon being contained in the form of nickel carbide.

2. A contacting component according to claim 1, wherein said contacting component is for use in a burn-in test.

3. A contacting component according to claim 1, wherein said contacting component is for use in a burn-in test in wafer batch testing.

4. A contacting component according to claim 1, wherein said contacting component is used in a contact board for use in a burn-in test.

5. A contacting component according to claim 1, wherein said contacting component is used in a contact board for use in a burn-in test in wafer batch testing.

6. A contacting component according to claim 1, wherein the content of carbon in the probe contact is adjusted by adding, to a plating solution, an organic substance soluble in the plating solution.

* * * * *